Dec. 27, 1966 P. PLESHKO 3,294,986

BISTABLE TUNNEL DIODE CIRCUIT

Filed Oct. 31, 1963 2 Sheets-Sheet 1

PETER PLESHKO
INVENTOR.

BY S. A. Giamatana
Francis L. Masselle
ATTORNEYS

BISTABLE TUNNEL DIODE CIRCUIT

Filed Oct. 31, 1963 2 Sheets-Sheet 2

PETER PLESHKO
*INVENTOR.*

BY S. A. Giamatana
Francis L. Masselle
ATTORNEYS 3,294,986

BISTABLE TUNNEL DIODE CIRCUIT

Peter Pleshko, Waldwick, N.J., assignor to General Precision Inc., Little Falls, N.J., a corporation of Delaware Filed Oct. 31, 1963, Ser. No. 320,309
5 Claims. (Cl. 307—88.5)

This invention relates generally to a bistable electronic circuit and more particularly to a tunnel diode circuit using a single reference voltage providing a bipolar output.

Prior to the present invention, similar circuits providing a bipolar output required the use of a plurality of voltage reference supplies. These voltage supplies have to be accurately controlled because the voltages have to differ by amounts on the order of millivolts. Accordingly, the cost of such circuits using multiple voltage reference supplies is greater than in those in which a single source could be used.

Also, prior to the present invention, tunnel diode circuits employing a pair of tunnel diodes to achieve appropriate output voltage swings were known. However, these circuits, in which two tunnel diodes are stacked in series, merely provide a unipolar output swing. The diodes utilized in such circuits normally are matched to have the same peak current values, and after normal operation the characteristics of one may change, which makes it difficult to predict which tunnel diode of the two will switch first.

With the recent development of the tunnel diode, there has been provided a component which is both bistable and can be switched from one state to another at extremely high speeds. This two-terminal active element exhibits a unique current-voltage characteristic having a low voltage positive resistance region and a high voltage positive resistance region, with a negative resistance region between them. Therefore, the tunnel diode can be biased so that it has two operating points, one each in the low voltage positive resistance region and high voltage positive resistance region, respectively. One stable state of the diode may be in the low voltage condition and the other stable state in the high voltage condition.

The output power available when the tunnel diode switches can be greater than the power needed to initiate such a switching. This is especially noticeable when the device switches from the low to the high voltage operating state. Besides this low power operating requirement, the tunnel diode also possesses wide operating temperature ranges, which makes it extremely useful in a wide variety of circuit configurations.

Because of the above favorable properties, the tunnel diode is becoming an invaluable circuit component. Its use in switching circuits, shift registers, pulse generators and squelch circuits is already known. It can also be used as an important component of a transistor driving circuit, as will be pointed out below.

Briefly, according to the invention, an input in the form of a pulse or other such waveform acts upon a circuit comprising two bistable semiconductor devices, such as a tunnel diode pair, arranged so as to provide a bipolar output voltage. The diodes are connected in series, cathode to cathode, and a reference voltage source is connected to the anode of one of the diodes. A bias resistor is arranged between the connection on the cathodes and a first bias voltage, and a second bias resistor is connected between the anode of the other diode and a second bias voltage. The bias voltages are selected to maintain the tunnel diodes in their respective stable states. The connection for the current input and voltage output is at the junction of the second bias resistor and the anode.

In an alternative embodiment, the reference voltage source is placed between the second bias resistor and the anode, while the first anode is connected directly to ground. In this embodiment, the input pulses are directed to the connection between the reference voltage source and the anode, while the voltage output connection is between the second bias resistor and the reference voltage source.

Accordingly, a principal object of the present invention is to provide an improved negative resistance element circuit.

Another object of the invention is the provision of an improved bistable tunnel diode circuit.

A further object of the invention is to provide a tunnel diode pair which exhibits two stable states and has an output voltage swing more positive than a reference voltage for one stable state, and an output voltage more negative than the reference voltage for the other stable state.

A still further object of the invention is the improvement of tunnel diode circuits to provide a bipolar voltage output.

Still another object of the present invention is to provide a transistor driving circuit with additional noise immunity due to the bipolar nature of the output.

A still further object of the invention is the provision of a bipolar voltage output with the use of a single noncritical voltage reference supply and two bias voltages.

Further objects and advantages of the present invention will become readily apparent as the following detailed description of the invention unfolds and when taken in conjunction with the accompanying drawings, wherein.

Figure 1:
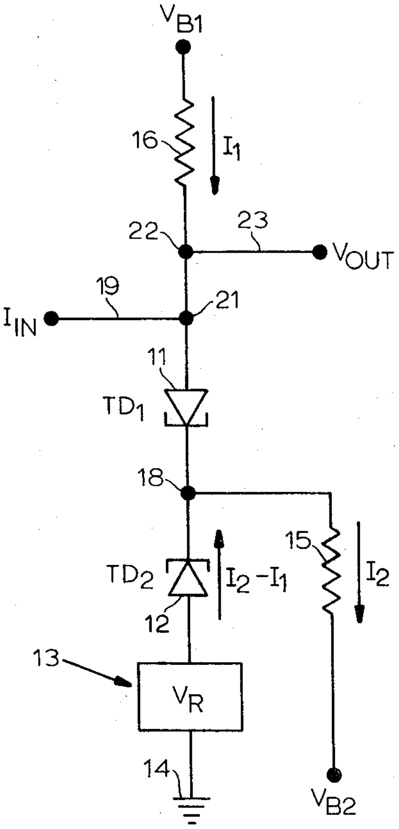
FIG. 1 is a circuit drawing illustrating one embodiment of the invention.

In FIG. 1, there is shown a pair of tunnel diodes 11 and 12 connected cathode-to-cathode in series opposed relationship. A reference voltage, $V_R$, is provided for the circuit through the anode of tunnel diode 12 by reference voltage source 13. Reference voltage source 13 is grounded at 14. A first bias resistor 16 is connected between a first bias source, $V_{B1}$, and the anode of tunnel diode 11. A second bias resistor 17 is connected between a second voltage bias source, $V_{B2}$, and the junction 18 between the cathodes of tunnel diodes 11 and 12. The remainder of the circuit consists of input and output terminal connections. As shown in FIG. 1, a current input, designated as $I_{in}$, is fed into the circuit on a line 19 to a junction 21, between the resistor 16 and the diode 11, while the voltage output, designated as $V_{out}$, is removed by a line 23 from a junction 22 also between the resistor 16 and the diode 11.

Figure 3:
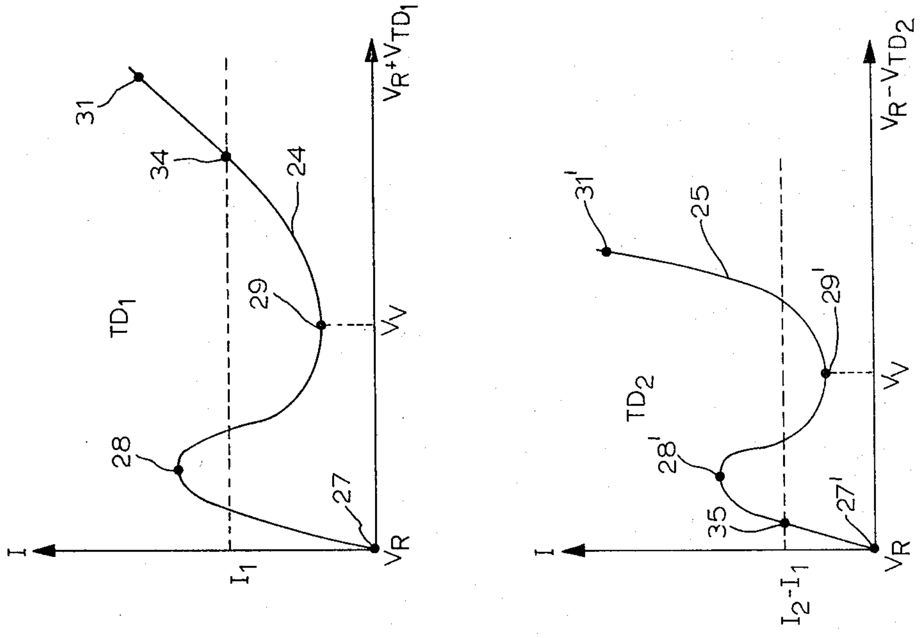
FIG. 3 is another voltage-current plot showing the tunnel diodes in a second stable state.
Figure 2:
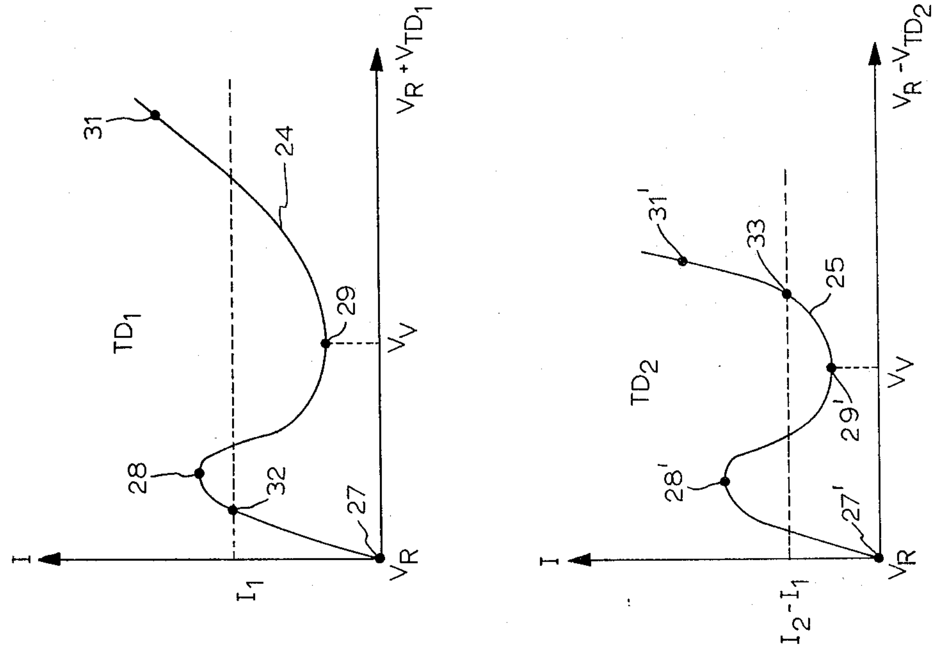
FIG. 2 is a typical voltage-current plot of the tunnel diodes utilized in the circuit of FIG. 1 showing a first stable state.

A better understanding of the operation of the circuit and especially tunnel diodes 11 and 12, may be had with reference to the voltage-current plots of FIGS. 2 and 3. In FIG. 2 there is shown a pair of voltage-current plots containing a curve 24 for tunnel diode 11, also designated as tunnel diode $TD_1$, and a curve 25 for tunnel diode 12, also designated as tunnel diode $TD_2$. Curves 24 and 25 represent the well known voltage-current characteristics of the tunnel diode with its two positive resistance voltage regions and its single negative resistance voltage region. When a tunnel diode is operated between points 27 and 28 on curve 24, it is said to be in its low voltage state, and when it is operated between points 29 and 31, it is said to be operating in its high voltage state. Thus, it is seen that the tunnel diode provides two stable operating regions, namely, those between points 27 and 28, and 29 and 31, respectively. With regard to current voltage curve 25, the two stable operating regions are those between 27' and 28', and 29' and 31'.

The current flowing through diode 11 in the forward direction is defined as $I_1$ and the current flowing from the junction 18 through the resistor 17 is defined as $I_2$. Accordingly, the current flowing through the diode 12 in the forward direction is $I_2$–$I_1$. FIG. 2 illustrates the voltage-current operating points of the diodes 11 and 12 when the circuit of FIG. 1 is in one stable state, and FIG. 3 illustrates the voltage-current operating points for the diodes 11 and 12 when the circuit of FIG. 1 is in the opposite stable state. In the stable state illustrated in FIG. 2, the diode 11 is in its low voltage state with the voltage-current operating point for the diode 11 being at 32, and the diode 12 is in its high voltage state with the voltage-current operating point for the diode 12 being at 33. In the stable state illustrated by FIG. 3, the tunnel diode 11 is in its high voltage state with the voltage-current operating point being at 34 and the tunnel diode 12 will be in its low voltage state with the voltage-current operating point for the diode 12 being at 35.

Initially, both tunnel diodes may be in the same state, i.e., high or low voltage state. However, the first input pulse will put the diodes in opposite states as indicated by the curves of FIGS. 2 or 3. The input will normally consist of positive or negative pulses.

Upon the application of a positive pulse on line 19 to junction 21, current $I_1$ will increase through the diode 11 driving the diode into its negative resistance region between points 28 and 29. At the same time the current $I_2$–$I_1$ will decrease, driving the diode 12 into the negative resistance region between points 28' and 29'. In the negative resistance region the applied positive pulse will cause the current $I_1$ in diode 11 to decrease and the current $I_2$–$I_1$ in the diode 12 to increase. Moreover, the decrease in the current $I_1$ augments the increase in the current $I_2$–$I_1$, and the increase in the current $I_2$–$I_1$ augments a decrease in the current $I_1$. As a result the effect is cumulative and the diode 11 is quickly switched to its high voltage state and the diode 12 is quickly switched to its low voltage state. Accordingly, an applied positive pulse will cause the circuit to switch from the stable state illustrated in FIG. 2 to the stable state illustrated in FIG. 3.

The resulting output on line 23 and junction 22, is a quick rise time voltage level change. The exact value of this voltage level is, of course, dependent upon the value of the reference voltage, $V_R$, and the value of the circuit components picked for the use desired. Another determining factor of the output is the type of tunnel diode used. The characteristics of gallium arsenide are such as to provide a greater voltage output than would be obtained from the use of tunnel diodes made of germanium, for instance.

If the circuit is in the state illustrated in FIG. 3, the application of a positive pulse will have no effect. Since tunnel diode 11 is already in its high voltage state and tunnel diode 12 in its low voltage state, an increase of current $I_1$ or a decrease in current $I_2$–$I_1$ will not cause the tunnel diodes to switch from their respective voltage states. Therefore, the current input pulse must be of such a polarity as to switch the tunnel diodes from their high and low voltage states before a voltage output is realized.

Upon the application of a negative pulse from line 19 to junction 21 the current $I_1$ through current diode 11 decreases and correspondingly the current through tunnel diode 12 increases. Assuming the circuit is in the stable state as indicated by FIG. 3, the negative pulse will cause the tunnel diode 11 to be driven into its negative resistance region between points 28 and 29 on its current-voltage characteristic. Similarly the current $I_2$–$I_1$ through the diode 12 will increase and the diode 12 will be driven into its negative resistance region between points 28' and 29'. The decrease in the current $I_1$ augments the increase in the curent $I_2$–$I_1$ and the increase in the current $I_2$–$I_1$ augments the decrease in the current $I_1$. As a result the effect is cumulative and the diode 11 will be quickly switched to its low voltage state and the diode 12 will be quickly switched to its high voltage state. Thus a negative input pulse will cause the circuit to switch from the stable state illustrated in FIG. 3 to the stable state illustrated in FIG. 2. A negative input pulse wil have no effect on the circuit if it is in the state indicated by FIG. 2.

The output voltage $V_{out}$ can be expressed in the following equation:

$$V_{out}=V_R+V_{TD_1}-V_{TD_2}$$

in which $V_{TD_1}$ is the voltage across diode 11 and $V_{TD_2}$ is the voltage across diode 12. In the stable state illustrated in FIG. 2, $V_{TD_2}$ will be greater than $V_{TD_1}$ so the output voltage will be more negative than $V_R$, and in the stable state illustrated in FIG. 3 $V_{TD_1}$ is greater than $V_{TD_2}$ so the output voltage wil be more positive than $V_R$. Thus, it can be seen that there is provided a tunnel diode circuit which provides a voltage output which can quickly change from a value more negative than a single reference voltage source to one more positive than the same source upon the application of an appropriate input pulse. The fact that the input pulse may be of a low value does not affect the operation of the circuit, nor the value of the voltage output level.

In FIGS. 2 and 3 the voltage corresponding to the diode valley current is designated as $V_V$. This is the voltage at which the high resistance region of a tunnel diode begins. It will be observed that the difference between $V_{TD_1}$ and $V_{TD_2}$ in both stable states of FIG. 2 and FIG. 3 is approximately $V_V$. Accordingly, the state shown in FIG. 2 will cause the output voltage to be approximately $V_R-V_V$, while the state shown in FIG. 3 will provide an output voltage of approximately $V_R+V_V$. These output voltages remain constant at the values above since each of the tunnel diodes are in stable states.

Figure 4:
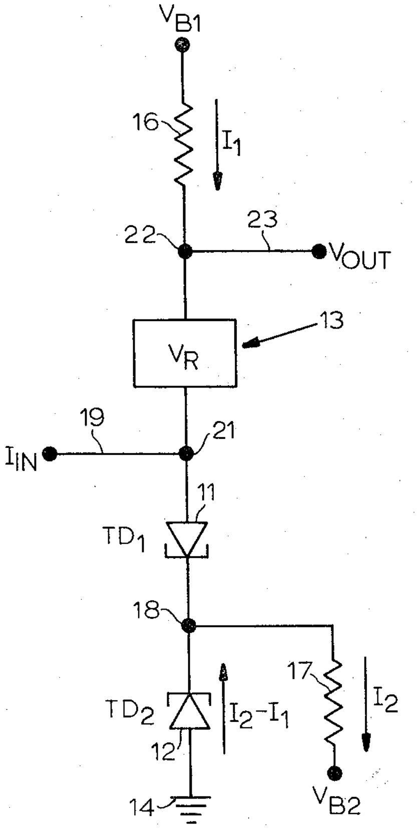
FIG. 4 is a circuit diagram of a second embodiment of the present invention.

FIG. 4 is a circuit diagram illustrating an alternative embodiment of the invention in which the reference voltage source is connected to the anode of the second tunnel diode. The circuit of FIG. 4 includes the same components as the circuit of FIG. 1.

As shown in FIG. 4, reference voltage source 13 is now connected between current input junction 21 and the voltage output junction 22. As can be noted, the voltage source is also between bias resistor 16 and the anode of tunnel diode 11. In this embodiment, the anode of tunnel diode 12 is connected directly to ground 14.

The operation of this embodiment is the same as that described for the circuit of FIG. 1. That is, upon an introduction of a negative pulse from line 19 to junction 21, current $I_1$ which flows through tunnel diode 11 decreases, while the current $I_2$–$I_1$ flowing through tunnel diode 12 increases. If the state of the circuit is such as shown by FIG. 2, the negative pulse input will have no effect and the circuit will remain in the same state. However, should the circuit be in the state designated by FIG. 3, it will go to that state shown in FIG. 2, as explained with reference to the circuit of FIG. 1. Briefly, tunnel diode 12 switches from its low voltage state to its high voltage state and the voltage-current operating point will go from point 35 of curve 25 as shown in FIG. 3 to the point designated as 33 of FIG. 2. Tunnel diode 11, however, is in its high voltage state shown at point 34 of FIG. 3, and will go to its low voltage state, namely point 32 of curve 24 as shown in FIG. 2. A voltage more negative than $V_R$ will then appear at the output, and its value will be approximately $V_r-V_v$.

While the circuit is in the state exemplified by FIG. 2, a positive current pulse applied to the junction 21 will increase the current through tunnel diode 11 and accordingly decrease the current through tunnel diode 11 and accordingly decrease the current through tunnel diode 12. Again, as pointed out in reference to the operation of the circuit of FIG. 1, tunnel diode 11 will switch from its low to its high voltage stage, while tunnel diode 12 will switch from its high to its low voltage state. With regard to the plots of FIGS. 2 and 3, tunnel diode 11 will go from operating point 32 to 34 of curve 24, while tunnel diode 12 will switch from operating point 33 to 35 on curve 25. A voltage more positive than $V_R$ now appears at junction 22 in line 23, with its value being approximately equal to $V_R+V_V$.

Thus it can be noted, that the placement of reference voltage source 13 in the anode circuit of tunnel diode 11 instead of the anode circuit of tunnel diode 12 will not affect the operation of the circuit. Properly biased, the circuits of FIG. 1 and FIG. 4 will operate in the same manner to achieve a bipolar voltage output, with the use of a single reference voltage source.

In conclusion, it can be seen that there is provided a tunnel diode circuit which is especially useful to drive a transistor input, the bipolar output of this circuit making it possible to reverse bias the transistor input terminals in the off condition, thereby giving the transistor circuit better noise immunity.

The above description is of preferred embodiments of the invention, and many modifications may be made thereto without departing from the spirit and scope of the invention, which is defined in the appended claims.

What is claimed is:

1. An electronic circuit comprising:

a circuit branch including a series combination of a reference voltage means and a pair of tunnel diodes connected back-to-back;

means for applying bias potentials to one end of said branch and to a point between said diodes to cause forward current flow through the diodes;

an input terminal connected to said branch at a point intermediate said one end of the branch and said diodes; and an output terminal connected to said branch at a point intermediate said one end of the branch and said diodes.

2. An electronic circuit comprising:

a circuit branch made up of a series combination of a reference voltage means, a pair of tunnel diodes connected back-to-back, and a first bias means at one end of the branch;

an input terminal connected to said branch at a point intermediate said bias means and said diodes;

an output terminal connected to said branch at a point intermediate said bias means and said diodes; and means, including said first bias means and a second bias means connected to said branch at a point between said diodes, for biasing said diodes so as to cause current flow therethrough in a forward direction.

3. An electronic circuit comprising:

a circuit branch made up of a series combination of a reference voltage means, a pair of tunnel diodes connected back-to-back, and a first resistive impedance means at one end of the branch;

an input terminal connected to said branch at a point intermediate said resistive impedance means and said diodes;

an output terminal connected to said branch at a point intermediate said resistive impedance means and said diodes;

second resistive impeadance means having one end connected to said branch at a point between said didoes; and means for applying respective bias potentials through said impedance means to said one end of the branch and to said point between the diodes, said bias potentials being of such magnitude and polarity with respect to the potential at the other end of the branch as to bias said diodes to cause forward current flow therethrough.

4. An electronic circuit according to claim 3, wherein said reference voltage means is located between the input terminal connections to the branch.

5. An electronic circuit according to claim 3, wherein said reference voltage means is located at said other end of the branch.

References Cited by the Examiner

UNITED STATES PATENTS

| | | | |
|---|---|---|---|
| 3,021,459 | 2/1962 | Gruggs et al. | 307—88.5 |
| 3,056,048 | 9/1962 | McGrogan | 307—88.5 |
| 3,111,593 | 11/1963 | Kaenel | 307—88.5 |
| 3,142,768 | 7/1964 | Kaufman | 307—88.5 |
| 3,151,253 | 9/1964 | Habayeb | 307—88.5 |
| 3,211,921 | 10/1965 | Kaufman | 307—88.5 |

FOREIGN PATENTS

| | | |
|---|---|---|
| 1,282,348 | 12/1961 | France. |

ARTHUR GAUSS, *Primary Examiner.*

R. H. EPSTEIN, *Assistant Examiner.*